United States Patent
Park

(10) Patent No.: US 6,796,316 B2
(45) Date of Patent: Sep. 28, 2004

(54) ATOMIC LAYER DEPOSITION (ALD) THIN FILM DEPOSITION EQUIPMENT HAVING CLEANING APPARATUS AND CLEANING METHOD

(75) Inventor: Young-Hoon Park, Pyungtaek-si (KR)

(73) Assignee: IPS Ltd. (KR)

(*) Notice: Subject to any disclaimer, the term of this patent is extended or adjusted under 35 U.S.C. 154(b) by 377 days.

(21) Appl. No.: 09/848,533

(22) Filed: May 3, 2001

(65) Prior Publication Data
US 2002/0007790 A1 Jan. 24, 2002

(30) Foreign Application Priority Data
Jul. 22, 2000 (KR) .............................. 00-42169

(51) Int. Cl.⁷ .................................................. B08B 7/04
(52) U.S. Cl. ..................... 134/22.18; 134/2; 134/30; 134/37; 134/902; 438/905
(58) Field of Search .................. 134/2, 22.1, 22.18, 134/26, 30, 34, 37, 902; 438/905

(56) References Cited

U.S. PATENT DOCUMENTS

| | | | |
|---|---|---|---|
| 4,960,488 A | * 10/1990 | Law et al. | 438/694 |
| 5,294,262 A | 3/1994 | Nishimura | |
| 5,338,363 A | * 8/1994 | Kawata et al. | 118/725 |
| 5,522,934 A | * 6/1996 | Suzuki et al. | 118/723 AN |
| 5,670,218 A | * 9/1997 | Baek | 427/576 |
| 5,926,743 A | 7/1999 | Xi et al. | |
| 5,963,834 A | 10/1999 | Hatano et al. | |
| 5,988,187 A | * 11/1999 | Trussell et al. | 134/22.1 |
| 6,183,563 B1 | * 2/2001 | Choi et al. | 118/715 |
| 6,217,658 B1 | * 4/2001 | Orczyk et al. | 118/697 |
| 6,573,184 B2 | * 6/2003 | Park | 438/680 |
| 6,579,372 B2 | * 6/2003 | Park | 118/715 |
| 6,626,185 B2 | * 9/2003 | Demos et al. | 134/1.1 |

FOREIGN PATENT DOCUMENTS

| | | |
|---|---|---|
| EP | 0 959 150 A2 | 11/1999 |
| KR | 1995-0027979 | 10/1995 |
| KR | P1997-067905 | 10/1998 |

OTHER PUBLICATIONS

"Notice to Submit Response in Korean Application No. 10-2000-0042169", Korean Patent Office, Nov. 15, 2002.

* cited by examiner

Primary Examiner—Alexander Markoff
(74) Attorney, Agent, or Firm—Cantor Colburn LLP

(57) ABSTRACT

An atomic layer desposition (ALD) thin film deposition equipment having a cleaning apparatus, this equipment including a reactor in which a wafer is mounted and a thin film is deposited on the wafer, a first reaction gas supply portion for supplying a first reaction gas to the reactor, a second reaction gas supply portion for supplying a second reaction gas to the reactor, a first reaction gas supply line for connecting the first reaction gas supply portion to the reactor, a second reaction gas supply line for connecting the second reaction gas supply portion to the reactor, a first inert gas supply line for supplying an inert gas from inert gas supply source to the first reaction gas supply line, a second inert gas supply line for supplying the inert gas from the inert gas supply source to the second reaction gas supply line, an exhaust line for exhausting the gas from the reactor to the outside, and a cleaning gas supply line connected to the first reaction gas supply line for supplying a cleaning gas for cleaning the reactor.

14 Claims, 9 Drawing Sheets

US 6,796,316 B2

ATOMIC LAYER DEPOSITION (ALD) THIN FILM DEPOSITION EQUIPMENT HAVING CLEANING APPARATUS AND CLEANING METHOD

BACKGROUND OF THE INVENTION

1. Field of the Invention

The present invention relates to atomic layer deposition (ALD) thin film deposition equipment, and more particularly, to ALD thin film deposition equipment employing a cleaning apparatus and a cleaning method.

2. Description of the Related Art

Thin film deposition equipment forms a predetermined thin film on a wafer by supplying reaction gases to the wafer received within a reactor. This thin film deposition equipment includes chemical vapor deposition (CVD) thin film deposition equipment, atomic layer epitaxy (ALE) thin film deposition equipment, and others, and has been applied to various fields for manufacturing semiconductor devices.

In thin film deposition equipment, a thin film is deposited not only on a wafer by an introduced reaction gas, but a thin film or process byproduct can also be deposited on the inner wall or component of a reactor, or on holes through which reaction gases are sprayed. When particles separated from the thin film or process byproduct drop on a wafer, the characteristics of a thin film deposited on the wafer are deteriorated. This requires a cleaning apparatus and method of effectively removing a thin film or a process byproduct deposited on the inner wall, components or holes of a reactor.

SUMMARY OF THE INVENTION

To achieve the above objective, the present invention provides an atomic layer deposition (ALD) thin film deposition equipment having a cleaning apparatus, this equipment including: a reactor in which a wafer is mounted and a thin film is deposited on the wafer; a first reaction gas supply portion for supplying a first reaction gas to the reactor; a second reaction gas supply portion for supplying a second reaction gas to the reactor; a first reaction gas supply line for connecting the first reaction gas supply portion to the reactor; a second reaction gas supply line for connecting the second reaction gas supply portion to the reactor; a first inert gas supply line for supplying an inert gas from an inert gas supply source to the first reaction gas supply line; a second inert gas supply line for supplying the inert gas from the inert gas supply source to the second reaction gas supply line; an exhaust line for exhausting the gas from the reactor to the outside; and a cleaning gas supply line connected to the first reaction gas supply line for supplying a cleaning gas for cleaning the reactor. Here, the cleaning gas is $ClF_3$.

Preferably, the cleaning gas supply line includes: a cleaning gas mass flow controller (MFC) for controlling the flow of a supplied cleaning gas; and at least one valve for allowing or blocking the flow of the cleaning gas. Also, preferably, the cleaning gas supply line further included a filter for filtering out foreign materials existing within the cleaning gas.

To achieve the above ojective, the present invention provides a cleaning method for ALD thin film deposition equipment having a reactor including a reactor block on which a wafer is mounted, a wafer block installed within the reactor block, on which the wafer is seated, and a diffusion plate having a plurality of spray holes formed over the wafer block and a plurality of nozzles slanted toward the inner sidewall of the reactor block to spray a gas toward the edges of the wafer block. This cleaning method includes a main cleaning process performed in a state where no wafers are received within the reactor, for spraying a mixture of a cleaning gas and an inert gas onto the wafer through the spray holes and spraying an inert gas toward the edges of the wafer block through the nozzles.

Preferably, this cleaning method further includes a sub cleaning process performed in a state where no wafers are received within the reactor, for pulse-introducing the cleaning gas into the reactor to induce instantaneous diffusion due to a pressure fluctuation. Also, preferably, this cleaning method further includes a pre-coating process performed in a state where no wafers are received within the reactor, for adhering fine particles remaining within the reactor to the inside surface of the reactor.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Figure 1:
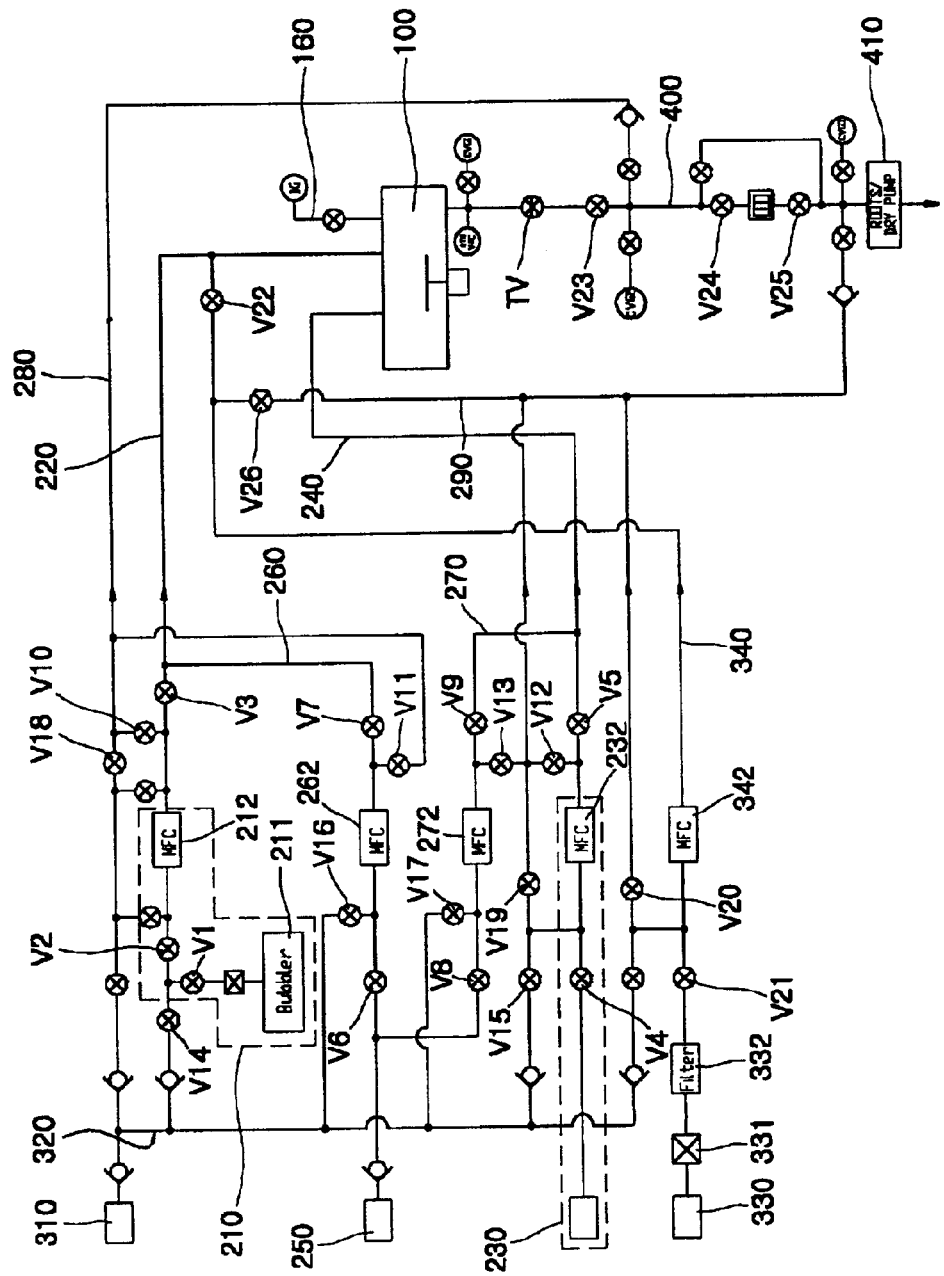
FIG. 1 is a schematic diagram of atomic layer deposition (ALD) thin film deposition equipment having a cleaning apparatus, according to a first embodiment of the present invention.

FIG. 1 shows atomic layer deposition (ALD) thin film deposition equipment having a cleaning apparatus, according to a first embodiment of the present invention. This ALD thin film deposition equipment can deposit a thin film, such as a TiN film or a TaN film, on a wafer. Deposition of a TiN thin film will now be described as an example. In order to form a TiN thin film, $TiCl_4$ is used as a first reaction gas, $NH_3$ is used as a second reaction gas, and Ar is used as an inert gas.

Referring to FIG. 1, ALD thin film deposition equipment includes a reactor 100 for receiving a wafer and depositing a thin film on the wafer, a gas jungle (this term was made by the present inventor to describe complicatedly-connected lines) for supplying a reaction gas to the reactor 100, and an exhaust line 400 for exhausting the gas within the reactor 100 to the outside.

Figure 2:
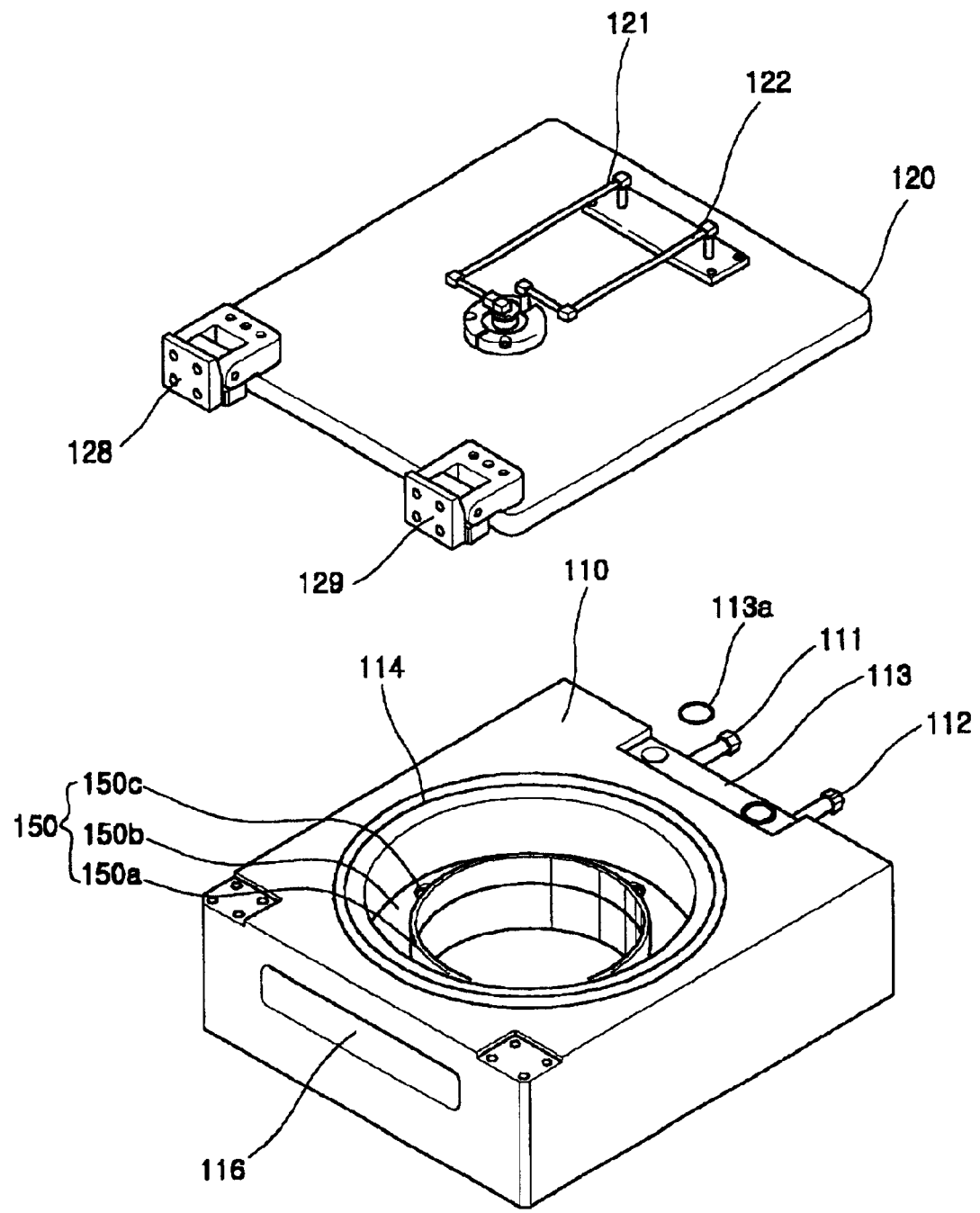
FIG. 2 is an exploded perspective view of a reactor in the ALD thin film deposition equipment of FIG. 1.
Figure 3:
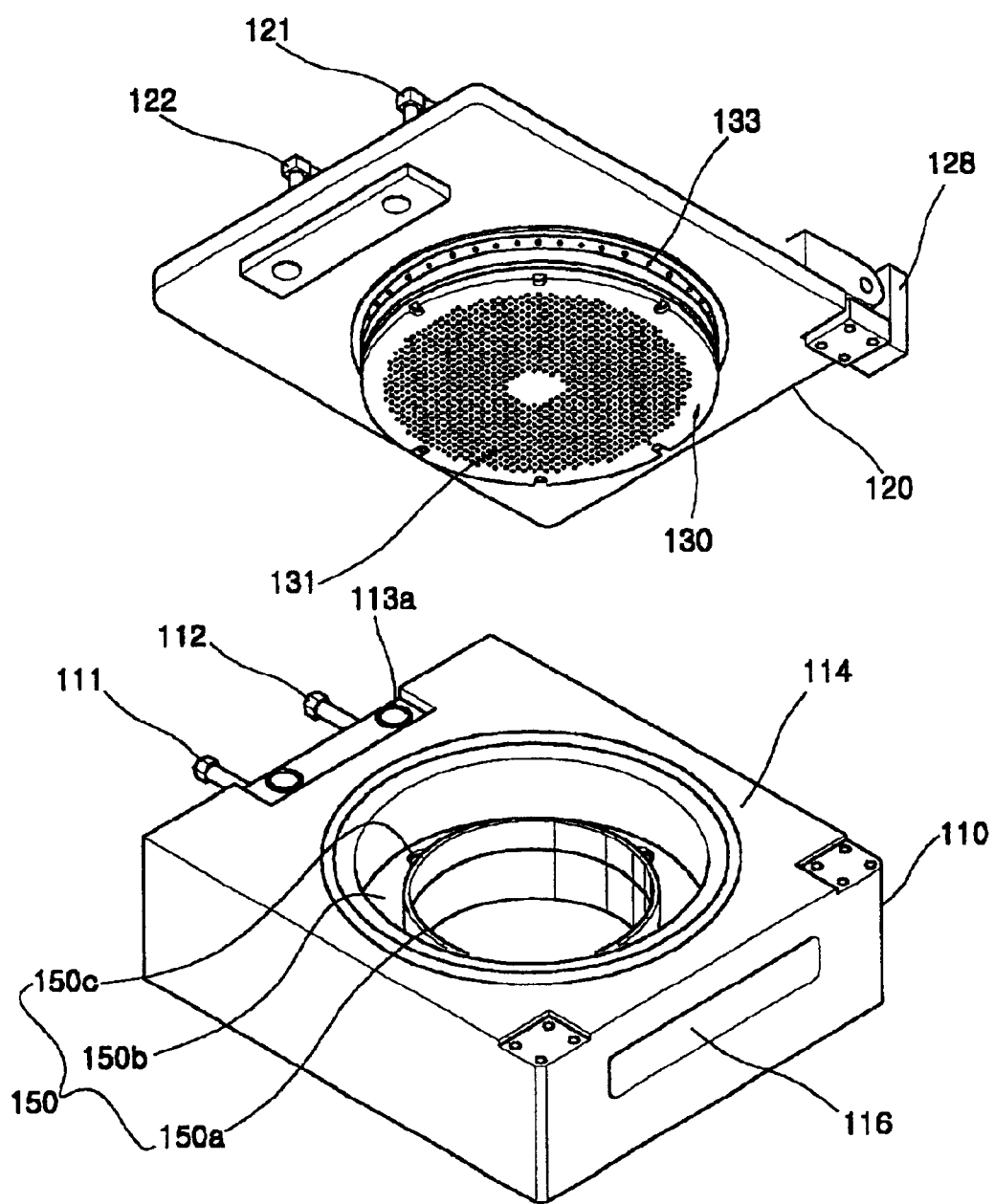
FIG. 3 is an exploded perspective view of a shower head and a diffusion plate in the reactor of FIG. 2.
Figure 4:
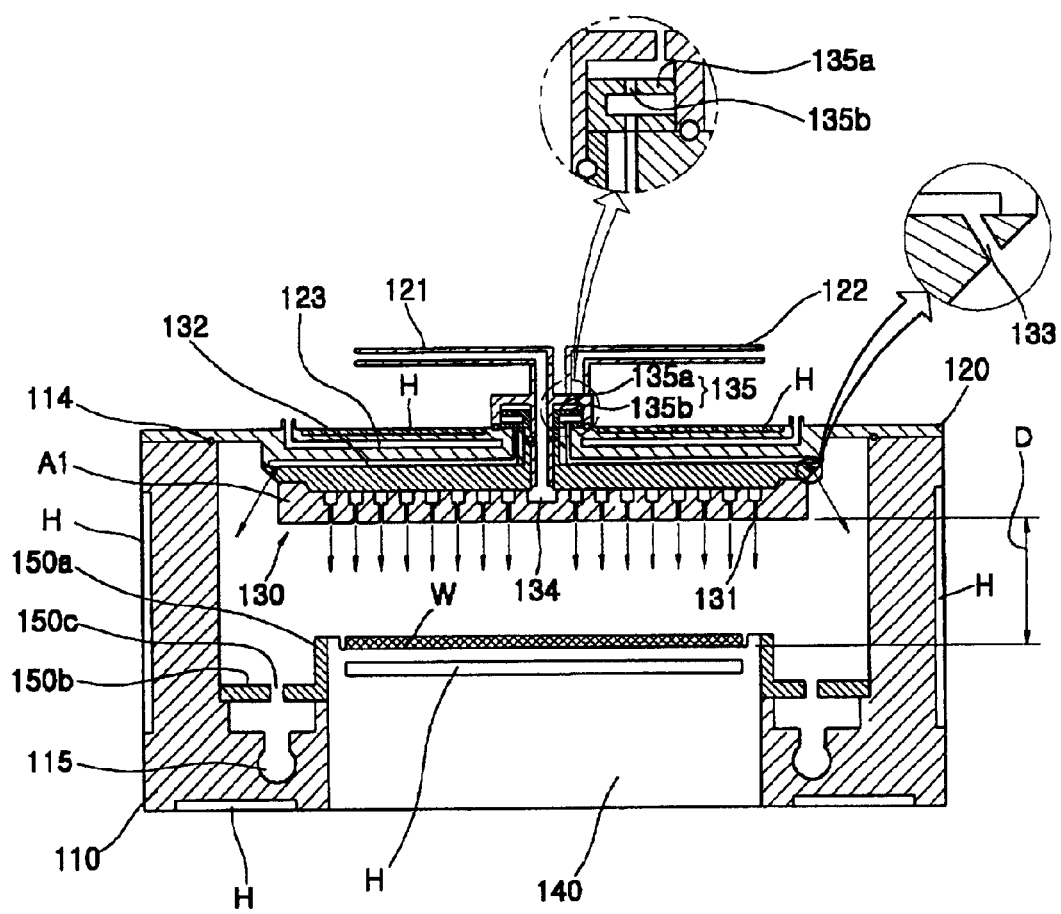
FIG. 4 is a cross-sectional view of the reactor of FIG. 2.
Figure 5:
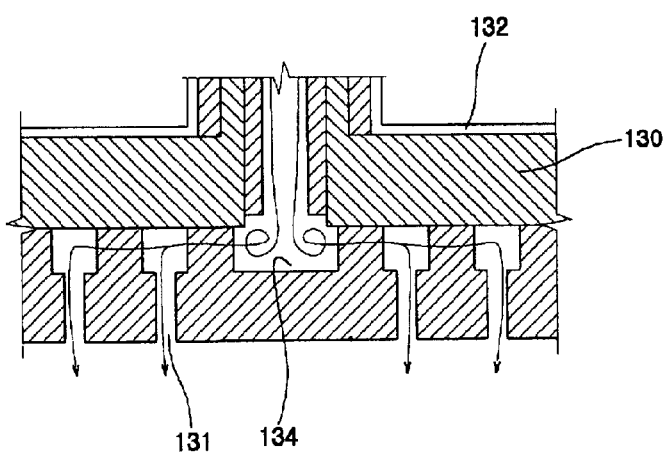
FIG. 5 is a magnified cross-sectional view of the first mixing unit of the reactor of FIG. 4.

FIG. 2 is an exploded perspective view of a reactor in the ALD thin film deposition equipment of FIG. 1. FIG. 3 is an exploded perspective view of the reactor of FIG. 2, in which a shower head plate is separated from a diffusion plate. FIG. 4 is a cross-sectional view of the reactor of FIG. 2, and FIG. 5 is a magnified cross-sectional view of the first mixing unit of the reactor of FIG. 4.

Referring to FIGS. 2, 3, 4 and 5, the reactor 100 includes a reactor block 110 on which a wafer is placed, a shower head plate 120 coupled to the reactor block 110 using hinges 128 and 129, a diffusion plate 130 installed on the shower head plate 120 for spraying a reaction gas and/or inert gas, and a wafer block 140 installed within the reactor block 110, on which a wafer is seated. A first connection line 121 for transferring a supplied first reaction gas and/or inert gas, and a second connection line 122 for transferring a supplied second reaction gas and/or inert gas, are installed on the shower head plate 120.

First and second connection pipes 111 and 112 are installed on the reactor block 110, and connected to first and second reaction gas supply lines 220 and 240, respectively, to be described later. The first and second connection pipes 111 and 112 are connected to the first and second connection lines 121 and 122 installed on the shower head plate 120 via a connecting portion 113 and an O-ring 113a so that they are sealed.

At least two exhaust holes 117 and 118 for exhausting introduced inert gases and/or reaction gases are formed to be symmetrical to each other on the bottom of the reactor block 110. A main O-ring 114 is installed on the upper surface of the reactor block 110, so that the reactor block 110 and the shower head plate 120 are securely sealed when the shower head plate 120 is covered.

The shower head plate 120 covers the reactor block 110, so that a predetermined pressure is constantly maintained within the reactor block 110. Also, the shower head plate 120 covers the reactor block 110 so that the diffusion plate 130 is placed within the reactor block 110.

The diffusion plate 130, which sprays a gas during a thin film deposition process, has a plurality of spray holes 131, which are connected to the first connection line 121, and spray a first reaction gas and/or inert gas over the wafer block 140, and a plurality of nozzles 133, which are connected to a passage 132 leading to the second connection line 122 and face the inner sidewall of the reactor block 110 to spray a second reaction gas and/or inert gas onto the edges of the wafer block 140.

A first mixing portion 134 for evenly mixing a first reaction gas and an inert gas and flowing the mixture to the spray hole 131 is formed at the center of the inside of the diffusion plate 130, as shown in FIGS. 4 and 5. The first reaction gas and the inert gas flowing via the connection line 121 are swirled and mixed, and then diffused and evenly sprayed onto the wafer via all of the spray holes 131.

Spray holes 131 are not formed below the first mixing portion 134 in the diffusion plate 130. Preferably, the entire area of the diffusion plate 130 having the spray holes 131 is larger than the area of a wafer w seated on the wafer block 140, so that a gas can be evenly spayed over the entire surface of the wafer.

The nozzles 133 lead to the passages 132 radially formed from a second mixing portion 135, and are slanted toward the inner sidewall of the reactor block 110, as shown in FIG. 4.

The second mixing portion 135 for evenly mixing a second reaction gas and an inert gas is formed between the second connection line 122 and the shower head plate 120, as shown in FIG. 4. The second mixing portion 135 has a structure in which a hole 135b is formed through a partition 135a.

The wafer block 140, on which a wafer w is safely seated, has a heater H installed in the wafer block 140 to heat and maintain the wafer block 140 to a predetermined temperature during deposition.

Figure 6:
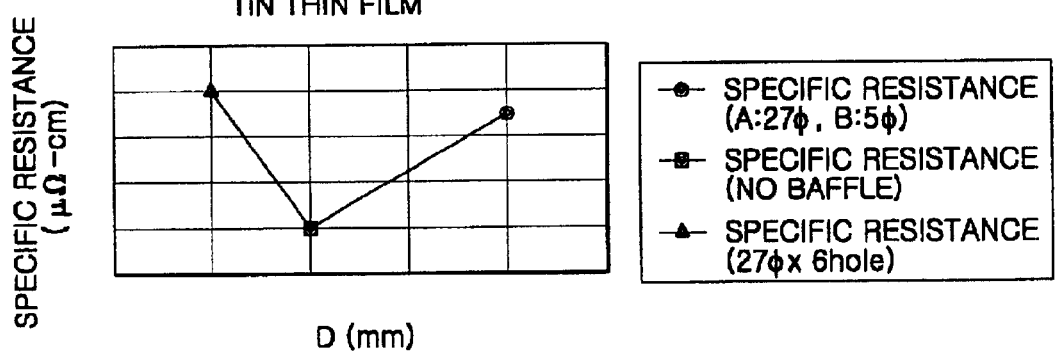
FIG. 6 is a graph showing the relationship between an interval (D) and a specific resistance while a thin film is formed.

The interval (D) between the diffusion plate 130 and the wafer block 140 is in the range of 20 mm to 50 mm. Referring to FIG. 6, which is a graph showing the interval (D) and specific resistance during deposition of a thin film, it can be seen that the specific resistance is the lowest when the interval (D) between the diffusion plate 130 and the wafer block 140 is 30 mm. However, when other conditions, for example, the types and amounts of first and second reaction gases, the temperature of a wafer block, or the like, were changed, specific resistance values were low at the intervals D within a range of about 20 to 50 mm, and it can be concluded that the interval D is an important structural property in forming an excellent thin film.

The interval within this range is compared to a conventional chemical vapor deposition (CVD) reactor in which the interval between a diffraction plate to which a reaction gas is sprayed and a wafer block on which a wafer is seated is about 50 to 100 mm. In the present invention, since the interval D is smaller than that in the prior art, a dense first reaction gas layer is formed on a wafer w by the pressure of a first reaction gas and/or inert gas sprayed from the spray holes 131. The first reaction gas layer reacts with a second reaction gas flowed in later, so that a thin film having a higher purity and an excellent electrical property can be formed.

A pumping baffle 150 is installed around the wafer block 140. The pumping baffle 150 is made up of a sidewall 150a installed on the lateral side of the wafer block 140, and a bottom wall 150b through which symmetrical holes 150c are formed. A donut-shaped pumping pot 115 connected to an exhaust line is formed below the bottom wall 150b of the pumping baffle 150, that is, on the bottom of the reactor block 110.

The sidewall 150a and the bottom wall 150b of the pumping baffle 150 provide a space in which a second reaction gas and/or inert gas sprayed toward the inner sidewall of the reactor block 110 can more evenly react to the first reaction gas layer formed on the wafer w seated on the wafer block 140. A process product generated during deposition of a thin film, and gases not used during deposition of a thin film are slipped through the hole 150c. These gases pass through the exhaust holes 117 and 118, and are exhausted via the pumping pot 115.

When a thin film is deposited, the pressure within a reactor must be maintained to be 1 to 10 torr. In order to observe and control this pressure, a pressure measuring portion 160 must be installed within the reactor.

The above-described thin film deposition reactor has heaters (H) formed inside and outside to heat the reactor when a thin film is deposited. For example, in a TiN thin film deposition process, when a TiN thin film is deposited, the temperature of the inner surface of the reactor block 110 must be kept at about 120 to 200° C., and the temperature of the diffusion plate 130 must be kept at about 150 to 260° C. Also, the wafer block 140 must be kept at a temperature of about 425 to 650° C., and the pumping baffle 150 must be kept at a temperature of about 150 to 230° C. The temperature of a vat valve 101 between the reactor 100 and a transfer module 102 for supplying and transferring a wafer w must be maintained at about 140 to 170° C. Such a temperature setting can minimize formation of process byproducts.

A coolant passage 123 for allowing a coolant to flow is formed on the shower head plate 120. The temperature of the diffusion plate 130 can be lowered within a desired range by flowing a coolant such as oil, water or air through the coolant passage 123.

During a thin film deposition process, the inside temperature of the reactor 100 is important. When the inside temperature of the reactor 100 departs an optimum temperature range, an excessive thin film or process byproduct is deposited on the surface of the diffusion plate 130. Thus, many particles drop on the wafer, and the diffusion plate 130 is eroded. Accordingly, the temperature of the diffusion plate 130 is also an important variable, and this will now be described with reference to FIG. 7.

Figure 7:
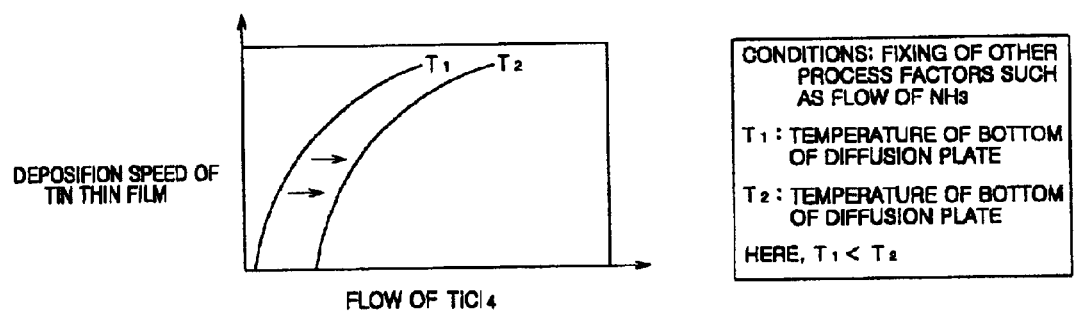
FIG. 7 is a graph showing the relationship between the bottom temperature of a diffusion plate and the speed of deposition of a TiN thin film when a TiN film is deposited using a $TiCl_4$ gas and an $NH_3$ gas.

FIG. 7 is a graph showing the relationship between the bottom temperature of the diffusion plate 130 and the speed of deposition of a TiN thin film, when a TiN film is deposited using a $TiCl_4$ gas and an $NH_3$ gas. A graph when the bottom temperature of the diffusion plate 130 is $T_1$, and a graph when the bottom temperature of the diffusion plate 130 is $T_2$, are shown in FIG. 7. Here, $T_2$ is greater than $T_1$. As shown in the graph of FIG. 7, when the temperature of the diffusion plate 130 exceeds the optimum temperature range, that is, when $T_1<T_2$, a greater amount of $TiCl_4$ gas must be introduced into the reactor 100 to obtain the same deposition speed of a TiN thin film, since a relatively greater amount of $TiCl_4$ gas are used to produce particles by reacting to the bottom of the diffusion plate 130 or to deposit a thin film on the diffusion plate 130, instead of being used to deposit a thin film on a wafer w. Accordingly, the increased temperature of the diffusion plate 130 needs to be easily lowered as necessary. In this case, the temperature of the diffusion plate 130 can be reduced by allowing a coolant to flow to the coolant passage 123 formed on the shower head plate 120. Consequently, during depositing a thin film, a thin film or process byproduct deposited on the bottom of a diffusion plate can be minimized by voluntarily increasing or decreasing the temperature of the diffusion plate 130. Thus, particles and undesired influences upon the process can be excluded, so finally a cleaning period can be increased, and a cleaning effect can be improved.

Figure 8:
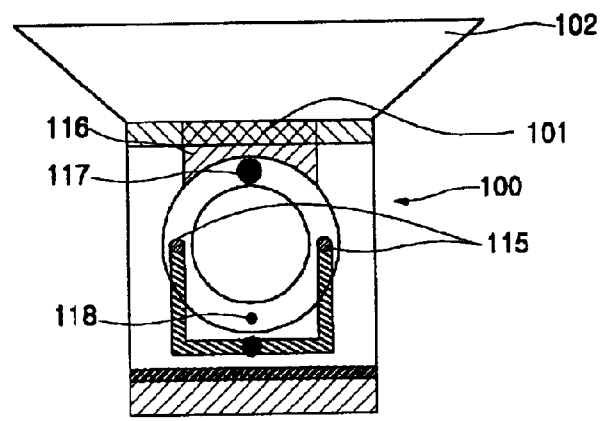
FIG. 8 shows a reactor combined with a transfer module through a vat valve.

The thin film deposition reactor having such a configuration is combined with a transfer module 102 for supplying and transferring a wafer w, having a vat valve 101 between them. The wafer w is transferred into the reactor 100 via a wafer transfer hole 116 using a robot arm (not shown) and seated on the wafer block 140, as shown in FIG. 8.

As shown in FIG. 1, the gas jungle includes a first reaction gas supply portion 210 for supplying a reaction gas to the reactor 100, and a second reaction gas supply portion 230 for supplying a second gas to the reaction gas 100. The first reaction gas supply portion 210 is connected to the reactor 100 via a first reaction gas supply line 220, and the second reaction gas supply portion 230 is connected to the reactor 100 via a second reaction gas supply line 240. A first inert gas supply line 260 through which an inert gas supplied from the inert gas supply source 250 is transferred is connected to the first reaction gas supply line 220, and a second inert gas supply line 270 through which an inert gas supplied from the inert gas supply source 250 is transferred is connected to the second reaction gas supply line 240.

The first reaction gas supply portion 210 includes a bubbler 211 for gasifying a first reaction material, a first reaction gas mass flow controller (MFC) 212 for controlling the flow of a first reaction gas supplied from the bubbler 211, and first and second valves V1 and V2 installed on the line between the bubbler 211 and the first reaction gas MFC 212 for allowing or blocking the flow of a first reaction gas. A third valve V3 for allowing or blocking the flow of the first reaction gas controlled by the first reaction gas MFC 212 is installed on the first reaction gas supply line 220.

The second reaction gas supply portion 230 includes a fourth valve V4 for allowing or blocking the flow of a second reaction gas, and a second reaction gas MFC 232 for controlling the flow of a second reaction gas passed through the fourth valve V4. A fifth valve V5 for allowing or blocking the flow of a second reaction gas controlled by the second reaction gas MFC 232 is installed on the second reaction gas supply line 240.

A sixth valve V6 for allowing or blocking the flow of a supplied inert gas, a first inert gas MFC 262 for controlling the flow of an inert gas passed through the sixth valve V6, and a seventh valve V7 for allowing or blocking the flow of an inert gas controlled by the first inert gas MFC 262, are installed on the first inert gas supply line 260.

An eighth valve V8 for allowing or blocking the flow of a supplied inert gas, a second inert gas MFC 272 for controlling the flow of an inert gas passed through the eighth valve V8, and a ninth valve V9 for allowing or blocking the flow of an inert gas controlled by the second inert gas MFC 272, are installed on the second inert gas supply line 270.

Here, the gas jungle includes a first bypass line 280 for allowing a first reaction gas and/or inert gas to flow directly to the exhaust line 400 without passing through the reactor 100, and a second bypass line 290 for allowing a second reaction gas and/or inert gas to flow directly to the exhaust line 400 without passing through the reactor 100.

The first bypass line 280 has a tenth valve V10 connected to the line between the first reaction gas MFC 212 and the third valve V3 for allowing or blocking the flow of a first reaction gas to the exhaust line 400, and an eleventh valve V11 connected to the line between the first inert gas MFC 262 and the seventh valve V7 for allowing or blocking the flow of an inert gas to the exhaust line 400.

The second bypass line 290 has a twelfth valve V12 connected to the line between the second reaction gas MFC 232 and the fifth valve V5 for allowing or blocking the flow of a second reaction gas to the exhaust line 400, and a thirteenth valve V13 connected to the line between the second inert gas MFC 272 and the ninth valve V9 for allowing or blocking the flow of an inert gas to the exhaust line 400.

The first and second bypass lines 280 and 290 are adopted to purge the lines within the gas jungle, when a small amount of gas flowed in while a material of a first or second reaction gas or an inert gas is exchanged must flow directly to the exhaust line 400 without passing by the reactor 100, when a contaminating source is generated within the lines, or when a new gas jungle is replaced. As described above, first and second reaction gases, air or contaminating sources remaining within lines are purged directly to the exhaust line 400 via the first and second bypass lines 280 and 290 by an inert gas, so that the reactor 100 can be prevented from being contaminated. Thus, the first and second bypass lines 280 and 290 are not used in processes for depositing a thin film, but used only in specific cases.

The gas jungle further includes a separate inert gas supply line 320 for supplying an inert gas from the inert gas supply source 310 in order to purge gases and/or contaminating sources remaining in the lines. The inert gas supply line 320 is organically connected to the first and second reaction gas supply portions 210 and 230, the first and second inert gas supply lines 260 and 270, the first and second bypass lines 280 and 290, and the exhaust line 400. The inert gas supply line 320 is connected to gas lines fundamentally required by a process, via a fourteenth valve V14 for allowing or blocking the flow of an inert gas to the first reaction gas supply portion 210, a fifteenth valve V15 for allowing or blocking the flow of an inert gas to the second reaction gas supply portion 230, a sixteenth valve V16 for allowing or blocking the flow of an inert gas to the first inert gas supply line 260, a seventeenth valve V17 for allowing or blocking the flow of an inert gas to the second inert gas supply line 270, an eighteenth valve V18 for allowing or blocking the flow of an inert gas to the first bypass line 280, and a nineteenth valve V19 for allowing or blocking the flow of an inert gas to the second bypass line 290.

The reactor 100, the first and second bypass lines 280 and 290 and a cleaning gas supply line 340 to be described later as a feature of the present invention are connected to the exhaust line 400. A throttle valve TV controlled by the internal pressure of the reactor 100 measured by the pressure measuring portion 160, for controlling the amount of an exhausted gas, is installed on the exhaust line 400. Twenty third, twenty fourth and twenty fifth valves V23, V24 and V25 for allowing or blocking the flow of an exhausted gas are also installed on the exhaust line 400. Her, the first bypass line 280 is connected to the line between the twenty third and twenty fourth valves V23 and V24, and the second bypass line 290 is connected to the line between the twenty fifth valve V25 and the exhaust pump 410.

In this gas jungle, a cold spot due to undesired condensation occurring when a reaction gas flows may be formed. Since a cold spot badly affects the process for depositing a thin film, heaters (not shown) for preventing generation of a cold spot are installed on the lines. Preferably, the heaters are independently installed at as many areas as possible along lines, and a temperature gradient is formed along a line. In this embodiment, the temperature gradient is established to be within a range of 40 to 200° C. toward the reactor 100.

The gas jungle further includes a cleaning gas supply line 340 for cleaning the reactor 100. The cleaning gas supply line 340 is connected to the first reaction gas supply line 220, and includes a cleaning gas supply portion 330 for supplying a cleaning gas, a twenty first valve V21 for allowing or blocking the flow of a supplied cleaning gas, a cleaning gas MFC 342 for controlling the flow of a cleaning gas which has passed through the twenty first valve V21, and a twenty second valve V22 for allowing or blocking the flow of a cleaning gas which has been controlled by the cleaning gas MFC 342. Here, a filter 332 for filtering out foreign materials existing within a cleaning gas is installed on the line between the cleaning gas supply portion 330 and the twenty first valve V21. In the above-described structure, a $ClF_3$ gas can be used as a cleaning gas.

Here, the cleaning gas supply line 340 is connected to the twenty sixth valve V26 and the second bypass line 290 connected to the exhaust line 400, in order to allow a cleaning gas to flow directly to the exhaust line 400 without passing through the reactor 100. A cleaning gas introduced via the cleaning gas supply line 340 is exhausted to the outside via the second bypass line 290 and the exhaust line 400, when the twenty second valve V22 is closed and the twenty sixth valve V26 is opened.

The operation of the first embodiment of ALD thin film deposition equipment having a cleaning apparatus with such a structure will now be described. This embodiment refers to a structure for depositing a TiN thin film on a wafer. To achieve this embodiment, $TiCl_4$ is used as a first reaction gas, $NH_3$ is used as a second reaction gas, and Ar is used as an inert gas. Thus, liquid $TiCl_4$ is contained in the bubbler 211.

The wafer w is transferred into the reactor 100 via the wafer transfer hole 116 using the robot arm (not shown) of the transfer module 102, and seated on the wafer block 140.

When the wafer w is seated on the wafer block 140, the temperature of the wafer block 140 increases within a range of 425 to 650° C., so that the temperature of the wafer w is increased to 400 to 600° C. After the wafer temperature is stabilized, the step of introducing a gas into the reactor 100 is performed.

The gas introducing step starts by opening the first valve V1, the sixth valve V6, the eighth valve V8, and the fourth valve V4 for several seconds. Then, a bubbled $TiCl_4$ gas is filled up to the second valve V2, and Ar gas is filled up to the seventh and ninth valves V7 and V9 after its amount is appropriately controlled by the first and second inert gas MFCs 262 and 272. An $NH_3$ gas is filled up to the fifth valve V5 after its amount is appropriately controlled by the second reaction gas MFC 232.

Next, an Ar gas is flowed into the reactor 100 through the seventh and ninth valves V7 and V9. Before the Ar gas is introduced, the internal pressure of the reactor 100 is kept at $10^{-4} \sim 5 \times 10^{-3}$ torr. However, as the Ar gas is introduced, the internal pressure of the reactor 100 is 1 to 10 torr. This pressure is obtained by the pressure measuring portion 160 installed in the reactor 100 appropriately opening the throttle valve TV of the exhaust line 400. Here, the reason why the seventh and ninth valves V7 and V9 are opened after the sixth and eighth valves V6 and V8 are opened is that the gas within the reactor 100 may flow backward through the seventh and ninth valves V7 and V9 when they are suddenly opened.

Thereafter, a TiN thin film is deposited on a wafer w by alternately introducing a $TiCl_4$ gas and an $NH_3$ gas into the reactor 100. For example, when a $TiCl_4$ gas is introduced first, a $TiCl_4$ gas and an Ar gas are first introduced into the reactor, in the first step. After a predetermined period of time, the $TiCl_4$ gas is excluded. Thus, a $TiCl_4$ layer is formed on the wafer w, and compressed by an Ar gas which is continuously introduced.

In the second step, an $NH_3$ gas and an Ar gas are introduced together. The supply of the $NH_3$ gas is blocked for a predetermined period of time. The $NH_3$ gas reacts to the $TiCl_4$ layer previously formed on the wafer w, thereby forming the TiN thin film on the wafer w. That is, a $TiN+NH_3$ layer is formed by the consecutive first and second steps.

Next, the first step is again performed to continuously grow a thin film on the $TiN+NH_3$ layer. Then, the $TiN+NH_3$ layer is changed to a $TiN+TiN+TiCl_4$ layer. Thereafter, the second step is performed to form a $TiN+TiN+TiN+NH_3$ layer. A TiN thin film having a desired thickness can be obtained by repeating this process.

This TiN thin film deposition process is performed by alternately opening and closing the third and fifth valves V3 and V5 in a state where the first and fourth valves V1 and V4 are always open, while an Ar gas is continuously introduced into the reactor 100 by opening the sixth, seventh, eighth and ninth valves V6, V7, V8 and V9.

Here, the second valve V2 is opened before the third valve V3, so that a $TiCl_4$ gas passes through the first reaction gas MFC 212 and is filled up to the third valve V3. Thereafter, when the third valve V3 is opened to send a first reaction gas to the reactor 100, the second valve V2 is closed. That is, the first reaction gas flows to the first reaction gas supply line 220 by sequentially passing through valves. A process byproduct gas generated during reaction is exhausted via the throttle valve TV of the exhaust line 400, and the twenty third, twenty fourth and twenty fifth valves V23, V24 and V25.

To sum up the above-described reaction, a $TiCl_4$ gas flows to the first reaction gas supply line 220 via the third valve V3 after its flow is controlled by the first and second valves V1 and V2, and an Ar gas is controlled in its flow, passes through the seventh valve V7, is mixed with the $TiCl_4$ gas on the first reaction gas supply line 220, and flows to the reactor 100.

Thereafter, a mixture of $TiCl_4$ and Ar pass through the first connection pipe 111 and the first connection line 121, is evenly mixed once more in the first mixing portion 134, and is evenly sprayed over the wafer w through the spray holes 131. An $NH_3$ reaction gas is controlled in its flow through the fourth valve V4, and then flows to the second reaction gas supply line 240 via the fifth valve V5. An Ar gas is controlled in its flow, passes through the ninth valve V9, is mixed with an $NH_3$ gas on the second reaction gas supply line 240, and then flows to the reactor 100. Next, a mixture of $NH_3$ and Ar pass through the second connection pipe 112 and the second connection line 122, is evenly mixed once more in the second mixing portion 135, and is sprayed toward the inner sidewall of the reactor block 110 through the nozzles 133.

Here, it is preferable that the flow of a $TiCl_4$ gas is 1 SCCM or more, the flow of an Ar gas to be mixed with a $TiCl_4$ gas is 50 SCCM or more, the flow of $NH_3$ is 50 SCCM or more, and the flow of an Ar gas to be mixed with an $NH_3$ gas is 60 SCCM or more. These values are obtained by several experiments. When the flow rates are at least as described above, a thin film having a high purity, an excellent electrical property, and a good step coverage can be obtained.

This thin film deposition is achieved by consecutive gas spraying to the reactor 100, and the process pressure of the reactor is kept constant by an appropriate signal exchange and control between a pressure measuring portion and valves including a throttle valve. Therefore, the uniformity of a deposited thin film is improved.

Also, when a compound gas containing Ta is used as a first reaction gas, and a compound gas containing N, for example, an $NH_3$ gas, is used as a second reaction gas, a TaN thin film can be deposited on a wafer by the method described above.

Here, an inert gas such as the Ar gas adequately dilutes the first and second reaction gases and smoothly sends the diluted gases to the reactor 100, so this acts as an important process variable. Also, the inert gas prevents a gas from flowing backward to a corresponding reaction gas supply line, since more than a predetermined amount of inert gas always flows to the first and second reaction gas supply lines 220 and 240 during, before and after a thin film is deposited on a wafer.

Hereinafter, a cleaning method according to the present invention will be described. The cleaning method includes a main cleaning process and a sub cleaning process for removing a thin film or process byproduct from the inner wall and components of the reactor 100 using a flowing cleaning gas and inert gas, and a pre-coating process for attaching particles remaining within the reactor 100 to the inner wall and components of the reactor.

The main cleaning process, which is performed in a state where no wafers w is received by the reactor 100, is performed in a predetermined cycle or when the number of particles produced by excessive deposition of a thin film or process byproduct (powder, a thin film containing impurities, etc.) on the inner wall of the reactor 100 or several components (for example, a wafer block, the sidewall 150a of a pumping baffle, etc.) exceeds a predetermined value. The cleaning cycle varies according to the type of a formed thin film. However, when a TiN, Ti or TiAlN thin film is deposited, the main cleaning process is performed after at least 500 wafers are deposited.

In the main cleaning process, a cleaning gas controlled in its flow by the cleaning gas MFC 342, and an inert gas controlled in its flow by the first inert gas MFC 262 are mixed in the first reaction gas supply lines 220, and sprayed onto the wafer block 140 through the spray holes 131 of the diffusion plate 130, and an inert gas controlled in its flow by the second inert gas MFC 272 is sprayed to the edges of the wafer block 140 through the second reaction gas supply line 240 and the nozzles 133 of the diffusion plate 130. In this embodiment, a $ClF_3$ gas is used as a cleaning gas, and an Ar gas is used as an inert gas.

A $ClF_3$ gas is nearly colorless transparent at room temperature, and has a boiling point of 11.75° C. The $ClF_3$ gas must not be liquefied until it is introduced into the reactor 100, and heaters must be installed along lines to apply an appropriate temperature to the gas.

An Ar gas adequately dilutes a $ClF_3$ gas by allowing the $ClF_3$ gas to flow to the diffusion plate 130 via the first reaction gas supply line 220, and allows the $ClF_3$ gas to smoothly flow into the reactor 100.

Upon the main cleaning process, the inside of the reactor must be set to a temperature which prevents damage to the material of the reactor due to excessive etching. Most of the components of the reactor are stable to a $ClF_3$ gas when they have a surface temperature of 170° C. or less, and it is proper that the temperature of an exhaust line is also 170° C. or less. Accordingly, heaters are controlled so that the surface temperature of the components of the reactor 100 except for the wafer block 140 does not exceed 200° C., preferably, is at 170° C. or less. Also, the main cleaning process is performed when the thin film deposition process temperature (425 to 650° C.) of the wafer block 140 is lowered to about 300° C.

Here, preferably, the flow of the $ClF_3$ gas is controlled to 50 SCCM or greater, the flow of an Ar gas, which is mixed with the $ClF_3$ gas, and flows to the spray holes 131, is controlled to 50 SCCM or greater, and an Ar gas flowing to the nozzles 133 via the second reaction gas supply line 240 is controlled to 300 SCCM or greater. It is preferable that the inside pressure of the reactor 100 is set to a range of 0.5 to 10 torr. This gas cleaning process requires about 50 to 90 minutes.

The sub cleaning process, which is performed in a state where the reactor 100 receives no wafers, is more simplified than the main cleaning process which is performed when the number of particles produced by local excessive deposition within the reactor 100 although a sufficient amount of process byproduct is not deposited within the reactor 100 exceeds a predetermined number.

The sub cleaning process denotes pulse introduction in which a $ClF_3$ gas is introduced into the reactor 100 by periodically opening and closing the twenty second valve V22. When the twenty second valve V22 is periodically opened and closed, a $ClF_3$ gas causes a pressure fluctuation within the reactor 100, and etches out a thin film or process byproducts excessively deposited on local areas within the reactor 100 while being instantaneously evenly diffused due to the pressure fluctuation when being introduced into the reactor.

Here, the flow rate of the $ClF_3$ gas is controlled to 50 SCCM or higher, the flow rate of an Ar gas, which is mixed with the $ClF_3$ gas and flows to the spray holes 131, is controlled to 50 SCCM or higher, and the flow rate of an Ar gas, which is mixed with the $ClF_3$ gas in the second reaction gas supply line 240 and flows to the nozzles 133, is controlled to 300 SCCM or higher.

In the pulse introduction process, while an Ar gas is continuously sprayed through the nozzles 133, a $ClF_3$ gas is introduced into the reactor 100 by periodically opening/closing the twenty second valve V22. The opening/closing period of the twenty second valve V22 is set to be about 1 to 2 seconds, and the total pulse introducing time is set to be about 5 minutes or more. Here, the inside pressure of the reactor 100 is set to be within a range of 0.5 to 10 torr. Also, the temperature of the wafer block 140 is set to be about 400° C. or less, and the temperatures of the components of the reactor 100 except for the wafer block 140 are set to be at most 200° C., preferably, at 170° C. or less.

In these main and sub cleaning processes, when a constant amount of a $ClF_3$ gas flows into the reactor 100 and the inside pressure of the reactor 100 is not variable, it is preferable that the sum of the amount of an Ar gas sprayed through the spray holes 131 and an Ar gas sprayed through the nozzles 133 is made constant in order to make the average etching speed of a thin film deposited on the entire inside surface of the reactor 100 uniform.

The pre-coating process is performed in a state where the reactor 100 receives no wafers, and adheres fine particles, which remain within the reactor 100 after the main cleaning process using a $ClF_3$ gas, to the inside surface of the reactor 100. This process prevents particles from dropping over a wafer during depositing a thin film.

The gases within the reactor 100 must be sufficiently exhausted before the pre-coating process is performed. In order to achieve this, after the main cleaning process or sub cleaning process is completed, pumping is performed as much as possible by 100% opening the throttle valve TV while introduction of all gases into the reactor 100 is stopped, thereby rapidly exhausting remaining $ClF_3$ gas and Ar gas within the reactor 100 and remaining process byproducts to the exhaust line 400.

When the inside of the reactor 100 is sufficiently in a vacuum state, the temperature of the wafer block 140, which has dropped during the main cleaning process, starts being increased to the thin film deposition process temperature of about 425 to 650° C. While the temperature of the wafer block 140 is increased, flushing for introducing an Ar gas into the reactor 100 is performed at the same time. Flushing is performed by opening the sixth and seventh valves V6 and V7 to allow an Ar gas to flow into the reactor 100 via the first reaction gas supply line 220 and simultaneously opening the eighth and ninth valves V8 and V9 to allow an Ar gas to flow into the reactor 100 via the second reaction gas supply line 240.

While the flushing is carried out, the temperature of the wafer block 140 increases up to the thin film deposition process temperature. When the temperature of the wafer block 140 is stabilized at the thin film deposition process temperature, the pre-coating process, which is similar to the thin film deposition process, is performed.

The pre-coating process is performed by mixing a flow-controlled $TiCl_4$ gas and an Ar gas and spraying onto the wafer block 140 through the spray holes 131, and mixing an $NH_3$ gas and a flow-controlled Ar gas and spraying toward the edges of the wafer block 140 through the nozzles 133.

Here, it is important to introduce an $NH_3$ gas at least several seconds before a $TiCl_4$ gas is introduced into the reactor, since a $TiCl_4$ gas is strongly erosive. If a $TiCl_4$ gas is first introduced into the reactor 100, it instantaneously etches the internal components of the reactor to thus generate very tiny solid particles. Thus, an $NH_3$ gas is introduced at least several seconds before a $TiCl_4$ gas is introduced, in order to pre-exist an $NH_3$ gas layer on the inside surface of the reactor 100, so that a $TiCl_4$ gas introduced reacts to the $NH_3$ gas. Therefore, etching is minimized. That is, when a compound gas containing Cl is used as the first reaction gas, and an $NH_3$ gas is used as the second reaction gas, the $NH_3$ gas is introduced at least several seconds before the first reaction gas is introduced into the reaction gas, in order to minimize generation of particles.

Thereafter, the first step of mixing and introducing the $TiCl_4$ gas and an Ar gas into the reactor 100 and excluding the $TiCl_4$ gas for a predetermined period of time, and the second step of introducing an $NH_3$ gas and an Ar gas into the reactor 100 and excluding the $NH_3$ gas for a predetermined period of time, are alternately repeated. Alternatively, the first step of mixing and introducing a $TiCl_4$ gas and an Ar gas and excluding the $TiCl_4$ gas for a predetermined period of time, while the $NH_3$ gas and an inert gas are continuously introduced, is repeated. In this way, the pre-coating process is achieved.

The pre-coating process is very similar to a thin film deposition process, except that it is performed in a state where no wafers are mounted within the reactor 100. Also, the pre-coating process is very similar to a thin film deposition process in terms of deposition conditions. That is, as in a thin film deposition process, when a compound gas containing a transfer metal element such as Ti, Ta or W is used as a first reaction gas, and an $NH_3$ gas is used as a second reaction gas, the temperature of the wafer w during thin film deposition is maintained at 400 to 600° C., and the temperature of lines connected to the reactor 100 is maintained at 40 to 200° C.

Figure 9:
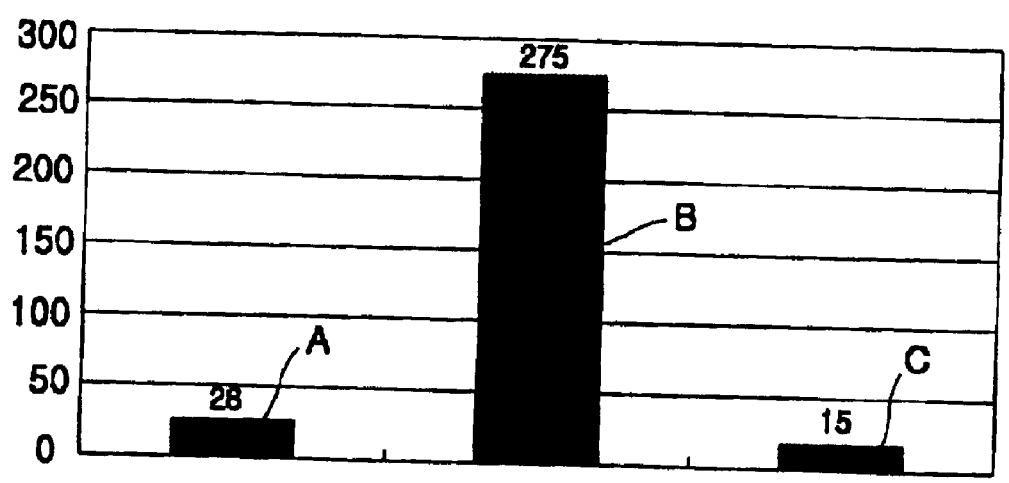
FIG. 9 is a data showing the number of particles detected within a reactor after a cleaning process.

Data of an experiment based on the thin film deposition equipment having such a structure is shown in FIG. 9. FIG. 9 shows the number of particles detected within a reactor before and after a cleaning process. In FIG. 9, reference character A denotes the number of particles detected after thin films are deposited on 500 wafers, reference character B denotes the number of particles detected after the main cleaning process, and reference character C denotes the number of particles detected after the pre-coating process. In this embodiment, 28 particles were detected after thin films are continuously deposited on 500 wafers, 275 particles were detected after a 60-minute cleaning process, and 15 particles were detected after a 10 minute pre-coating process. Here, the detection of 275 particles after the cleaning process shows not that the inside of the reactor 100 is contaminated, but that cleaning process byproducts existing within a diffusion plate during cleaning remain by failing to slipping to an exhaust line and drop over the wafer w. Thereafter, if the pre-coating process is performed, the number of particles detected can be significantly reduced.

The above-described cleaning process is different from a conventional wet cleaning process, which is performed in a state where a reactor is opened, and can minimize a time loss caused during the wet cleaning process. In this embodiment, the cleaning process can be performed at least five to ten times in a cycle of about 500 wafers or more.

Figure 10:
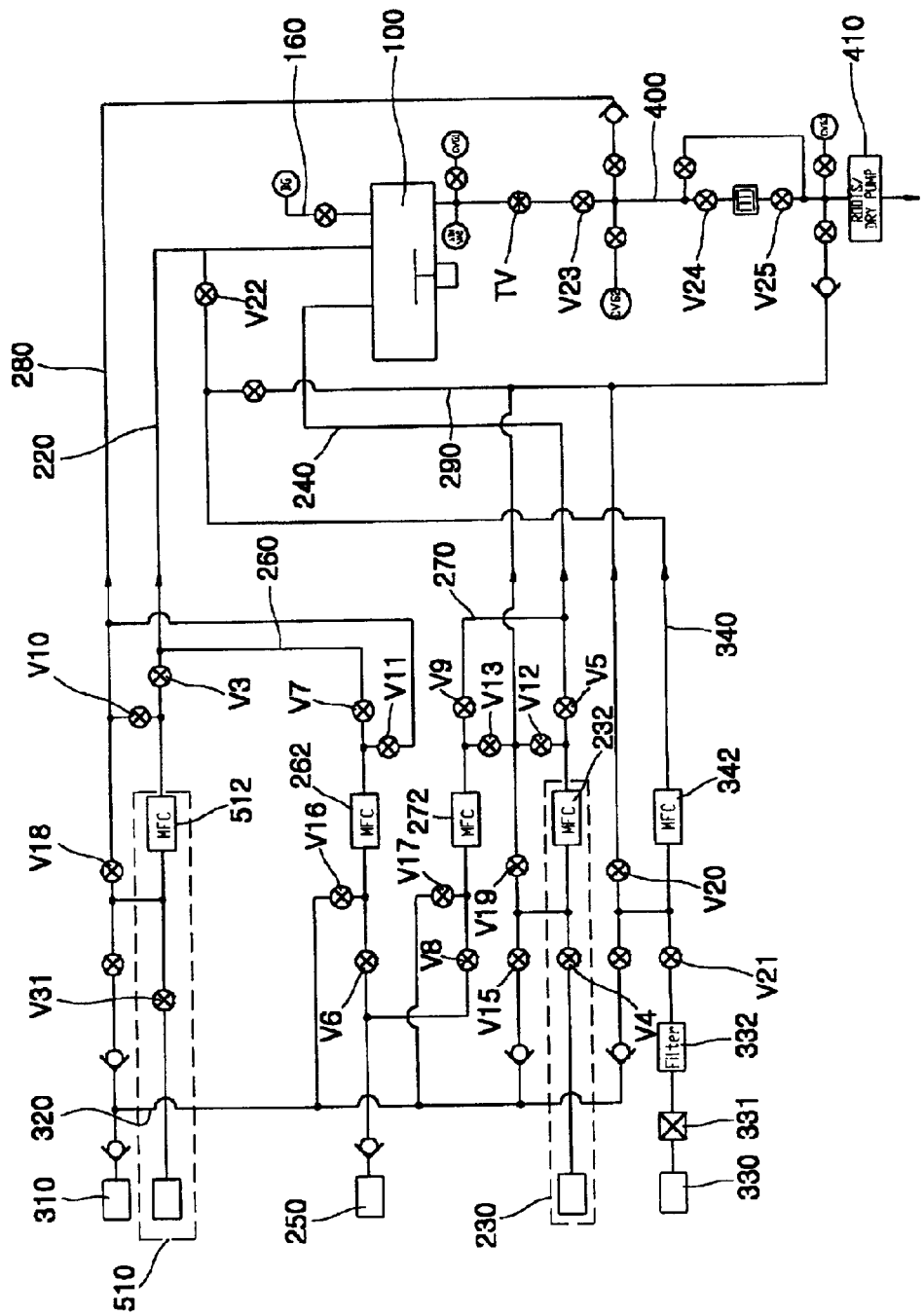
FIG. 10 is a cross-sectional view of ALD thin film deposition equipment having a cleaning apparatus, according to a second embodiment of the present invention.

A second embodiment of ALD thin film deposition equipment having a cleaning apparatus according to the present invention will now be described with reference to FIG. 10. The same reference numerals as those in FIG. 1 denote the same elements.

In contrast to the first embodiment in which a TiN or TaN thin film can be deposited on a wafer, a thin film such as a WN thin film can be formed in the second embodiment. In order to achieve the second embodiment, the first reaction gas supply portion 210 in the first embodiment is replaced with a first reaction gas supply portion 510. The first reaction gas supply portion 510 includes a thirty first valve V31 of allowing or blocking the flow of a first reaction gas, and a first reaction gas MFC 512 for controlling the flow of a first reaction gas which has passed through the thirty first valve V31. The first reaction gas supply portion 510 is connected to the third valve V3.

That is, in this structure, when a WN thin film is formed, WF6 is used as the material of a first reaction gas, a compound gas containing N, for example, an NH$_3$ gas, is used as a second reaction gas, and an Ar gas is used as an inert gas. The WN thin film deposition method using the above-mentioned gases is almost the same as a TiN deposition method, so it will not be described in detail.

Figure 11:
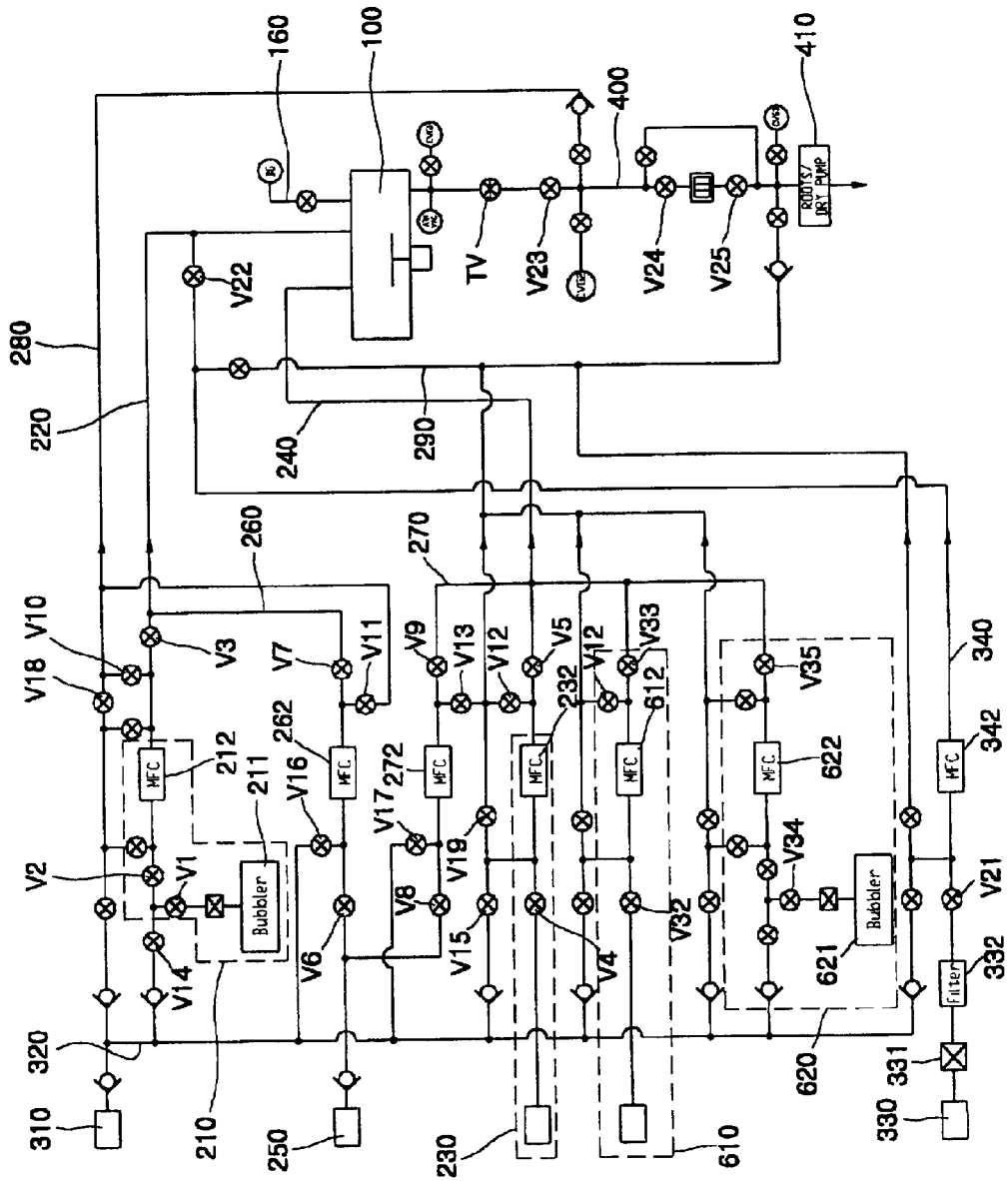
FIG. 11 is a cross-sectional view of ALD thin film deposition equipment having a cleaning apparatus, according to a third embodiment of the present invention.

A third embodiment of ALD thin film deposition equipment having a cleaning apparatus according to the present invention will now be described with reference to FIG. 11. The same reference numerals as those in FIG. 1 denote the same elements.

In contrast to the first embodiment in which a TiN or TaN thin film can be deposited on a wafer, a thin film such as a Ti or TiAlN film as well as a TiN or TaN film can be formed in the third embodiment. In order to achieve this, the third embodiment further includes a third reaction gas transfer line for transferring a third reaction gas TriMethylAluminum (TMA) and a fourth reaction gas transfer line for transferring a fourth reaction gas H$_2$.

A fourth reaction gas supply portion 610 includes a thirty second valve V32 for allowing or blocking the flow of supplied H2, a fourth reaction gas MFC 612 for controlling the flow of H2 which has passed through the thirty second valve V32, and a thirty third valve V33 for allowing or blocking the flow of H2 controlled by the fourth reaction gas MFC 612.

A third reaction gas supply portion 620 includes a bubbler 621 for gasifying a third reaction material, a third reaction gas MFC 622 for controlling the flow of a third reaction gas, a thirty fourth valve V34 installed on the line between the bubbler 621 and the third reaction gas MFC 622 for allowing or blocking the flow of the third reaction gas, and a thirty fifth valve V35 for allowing or blocking the flow of the third reaction gas, which has been controlled by the third reaction gas MFC 622, to the second reaction gas supply line 240.

That is, in this structure, in order to form a thin film such as a Ti or TiAlN thin film as well as a TiN or TaN thin film, a compound gas containing a transfer metal element Ti or Ta is used as a first reaction gas, an Ar gas is used as an inert gas, a compound gas containing N is used as a second gas, a TMA gas is used as a third reaction gas, and an H$_2$ gas is used as a fourth reaction gas.

The third embodiment of the thin film deposition apparatus having such a configuration is almost the same as the first embodiment, so it will not be described in detail.

In all of the embodiments described above, Ti, TiN, TiAlN, WN and TaN thin films are mentioned as an ALD thin film. These embodiments are representative of the present invention. Thus, the present invention can also be applied when an ALD thin film containing a transfer metal element such as WSIN, TiSiN or TaSiN is deposited using changed reaction gases.

In a cleaning apparatus and method in ALD thin film deposition equipment according to the present invention, a thin film or process byproducts deposited within a reactor or on the surfaces of components of the reactor are effectively dry-cleaned without opening the reactor. Thus, a thin film deposition process can be easily performed after cleaning.

Also, when a thin film such as Ti, TiAlN, TiN, TaN, WN, WSIN, TiSiN or TaSiN thin film is formed, a thin film and process byproducts can be effectively removed from the inner wall or components of a reactor during a cleaning process, after a thin film deposition process.

What is claimed is:

1. A cleaning method for an ALD thin film deposition equipment comprising a reactor including a reactor block on which a wafer is mounted, a wafer block installed within the reactor block, on which the wafer is seated, and a diffusion plate having a plurality of spray hole formed over the wafer block and a plurality of nozzles slanted toward the inner sidewall of the reactor block to spray a gas toward the edges of the wafer block, the cleaning method comprising:
   performing a main cleaning process in a state where no wafers are received within the reactor, including spraying a mixture of a cleaning gas and an inert gas onto the wafer block through the spray holes and spraying the inert gas toward edges of the wafer block through the nozzles.

2. The cleaning method of claim 1, wherein the main cleaning process further comprises setting a flow rate of the cleaning gas at 50 SCCM or higher, mixing the inert gas with the cleaning gas and flowing the mixture to the spray holes to be at 50 SCCM or higher, and setting a flow rate of the inert gas to the nozzles at 300 SCCM or higher.

3. The cleaning method of claim 2, further comprising setting an inside pressure of the reactor to be 0.5 to 10 torr.

4. The cleaning method of claim 2, further comprising setting the an inside surface temperature of the reactor, except for the wafer block, to be 200° C. or less.

5. The cleaning method of claim 1, further comprising performing a sub cleaning process in the state where no wafers are received within the reactor, including pulse-introducing the cleaning gas into the reactor to induce instantaneous diffusion due to pressure fluctuation.

6. The cleaning method of claim 5, wherein the sub cleaning process further comprises setting the flow rate of the cleaning gas to be at 50 SCCM or higher, mixing the inert gas with the cleaning gas and flowing the mixture to the spray holes at 50 SCCM or higher, and setting a flow rate of the inert gas to the nozzles at 300 SCCM or higher.

7. The cleaning method of claim 5, further comprising setting an inside pressure of the reactor to be 0.5 to 10 torr.

8. The cleaning method of claim 5, further comprising setting an inside surface temperature of the reactor, except for the wafer block, to be 200° C. or less.

9. The cleaning method of claim 1, further comprising performing a pre-coating process in the state where no wafers are received within the reactor, including adhering fine particles remaining within the reactor to an inside surface of the reactor.

10. The cleaning method of claim 9, wherein the pre-coating process comprises spraying a first mixture gas of a first reaction gas and the inert gas onto the wafer block through the spray holes, and spraying a second mixture gas of a second reaction gas and the inert gas toward edges of the wafer block through the nozzles.

11. The cleaning method of claim 9, wherein the pre-coating process comprises introducing first mixture gas of a first reaction gas and the inert gas; introducing the inert gas without the first reaction gas for a predetennined period of time; introducing a second mixture gas of a second reaction gas and the inert gas into the reactor; and introducing the inert gas without the second reaction gas for a predetermined period of time.

12. The cleaning method of claim 9, wherein the pre-coating process comprises introducing a first mixture gas of a first reaction gas and the inert gas and introducing the inert gas without the first reaction gas for a predetermined period of time in a state where a second reaction gas and the inert gas are continuously introduced into the reactor.

13. The cleaning method of claim 9, wherein the pre-coating process comprises introducing $NH_3$ gas into the reactor at least several seconds before introducing a first reaction gas into the reactor, when a compound gas containing Cl is used as the first reaction gas, and the $NH_3$ gas is used as a second reaction gas.

14. The cleaning method of claim 1, wherein the cleaning gas is $ClF_3$.

* * * * *